(12) United States Patent
Malandruccolo et al.

(10) Patent No.: US 11,671,775 B2
(45) Date of Patent: Jun. 6, 2023

(54) MICROPHONE ASSEMBLY WITH TRANSDUCER SENSITIVITY DRIFT COMPENSATION AND ELECTRICAL CIRCUIT THEREFOR

(71) Applicant: Knowles Electronics, LLC, Itasca, IL (US)

(72) Inventors: Vezio Malandruccolo, Rapperswil (CH); Mark Niederberger, Einsiedeln (CH); Weiwen Dai, Elgin, IL (US); Luca Bettini, Zurich (CH)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 228 days.

(21) Appl. No.: 17/138,471

(22) Filed: Dec. 30, 2020

(65) Prior Publication Data
US 2022/0210590 A1   Jun. 30, 2022

(51) Int. Cl.
*H04R 29/00* (2006.01)
*H04R 3/00* (2006.01)
*H04R 19/04* (2006.01)

(52) U.S. Cl.
CPC ............. *H04R 29/004* (2013.01); *H04R 3/00* (2013.01); *H04R 19/04* (2013.01); *B81B 2201/0257* (2013.01); *H04R 2201/003* (2013.01)

(58) Field of Classification Search
CPC ........ H04R 29/004; H04R 3/00; H04R 19/04; H04R 2201/003; B81B 2201/0257
See application file for complete search history.

(56) References Cited

U.S. PATENT DOCUMENTS

| | | | |
|---|---|---|---|
| 7,190,038 B2 | 3/2007 | Dehe et al. | |
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 2005/0207605 A1* | 9/2005 | Dehe | H04R 19/04 |
| | | | 381/369 |
| 2007/0278501 A1 | 12/2007 | Macpherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |

(Continued)

FOREIGN PATENT DOCUMENTS

| | | | | |
|---|---|---|---|---|
| CN | 106878893 A | * | 6/2017 | ............... G01K 7/00 |
| TW | I287352 B | * | 7/2007 | ........... H03G 3/3026 |

(Continued)

*Primary Examiner* — Oyesola C Ojo
(74) *Attorney, Agent, or Firm* — Foley & Lardner LLP

(57) ABSTRACT

The disclosure relates generally to microphone and vibration sensor assemblies (100) having a transducer (102), like a microelectromechanical systems (MEMS) device, and an electrical circuit (103) disposed in a housing (110) configured for integration with a host device. The electrical circuit includes a variable gain signal processing circuit (203) that processes an electrical signal from the transducer and a gain control circuit (204) that compensates for transducer sensitivity drift caused by variation in an environmental condition of the transducer, and electrical circuits therefor.

20 Claims, 4 Drawing Sheets

(56) References Cited

U.S. PATENT DOCUMENTS

| | | | |
|---|---|---|---|
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0166228 A1* | 7/2010 | Steele | A61B 8/56 381/113 |
| 2010/0183181 A1 | 7/2010 | Wang | |
| 2010/0242611 A1* | 9/2010 | Terazawa | G01S 15/931 73/629 |
| 2010/0246877 A1* | 9/2010 | Wang | B81B 7/0061 381/361 |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0269363 A1* | 10/2012 | Suvanto | H04R 1/04 381/107 |
| 2016/0087596 A1* | 3/2016 | Yurrtas | H04R 1/04 381/111 |
| 2017/0243577 A1* | 8/2017 | Wingate | G10L 15/22 |
| 2018/0359551 A1* | 12/2018 | Yang | H04R 31/006 |
| 2019/0387326 A1 | 12/2019 | Hansen et al. | |
| 2020/0010315 A1 | 1/2020 | Tingleff et al. | |
| 2021/0396795 A1 | 12/2021 | Jennings et al. | |

FOREIGN PATENT DOCUMENTS

| | | | | |
|---|---|---|---|---|
| TW | I287352 B | * | 9/2007 | H03G 3/3026 |
| WO | WO-2019133739 A1 | * | 7/2019 | A61B 1/00006 |

* cited by examiner

MICROPHONE ASSEMBLY WITH TRANSDUCER SENSITIVITY DRIFT COMPENSATION AND ELECTRICAL CIRCUIT THEREFOR

FIELD OF THE DISCLOSURE

The present disclosure relates generally to microphone and other sensor assemblies and more particularly to sensor assemblies having transducer sensitivity drift compensation, and electrical circuits therefor.

BACKGROUND

Microphone assemblies having a transducer that converts sound into an electrical signal conditioned or processed by an integrated circuit are known generally and integrated with cell phones, personal computers, smart speakers and internet of things (IoT) devices, among other host devices. The transducer is commonly implemented as a microelectromechanical systems (MEMS) device. However the sensitivity of these and other transducers tends to drift with variations in temperature and other environmental conditions of the host device. Such sensitivity drift can adversely affect the performance of the microphone.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

Those of ordinary skill in the art will appreciate that the figures are illustrated for simplicity and clarity and therefore may not be drawn to scale and may not include well known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to microphone and other sensor assemblies comprising a transducer subject to varying environmental conditions like temperature, humidity, and pressure, among others that causes sensitivity drift affecting the performance of the sensor assembly, and more particularly to sensor assemblies and electrical circuits for such sensor assemblies that compensate for transducer sensitivity drift.

Figure 1:
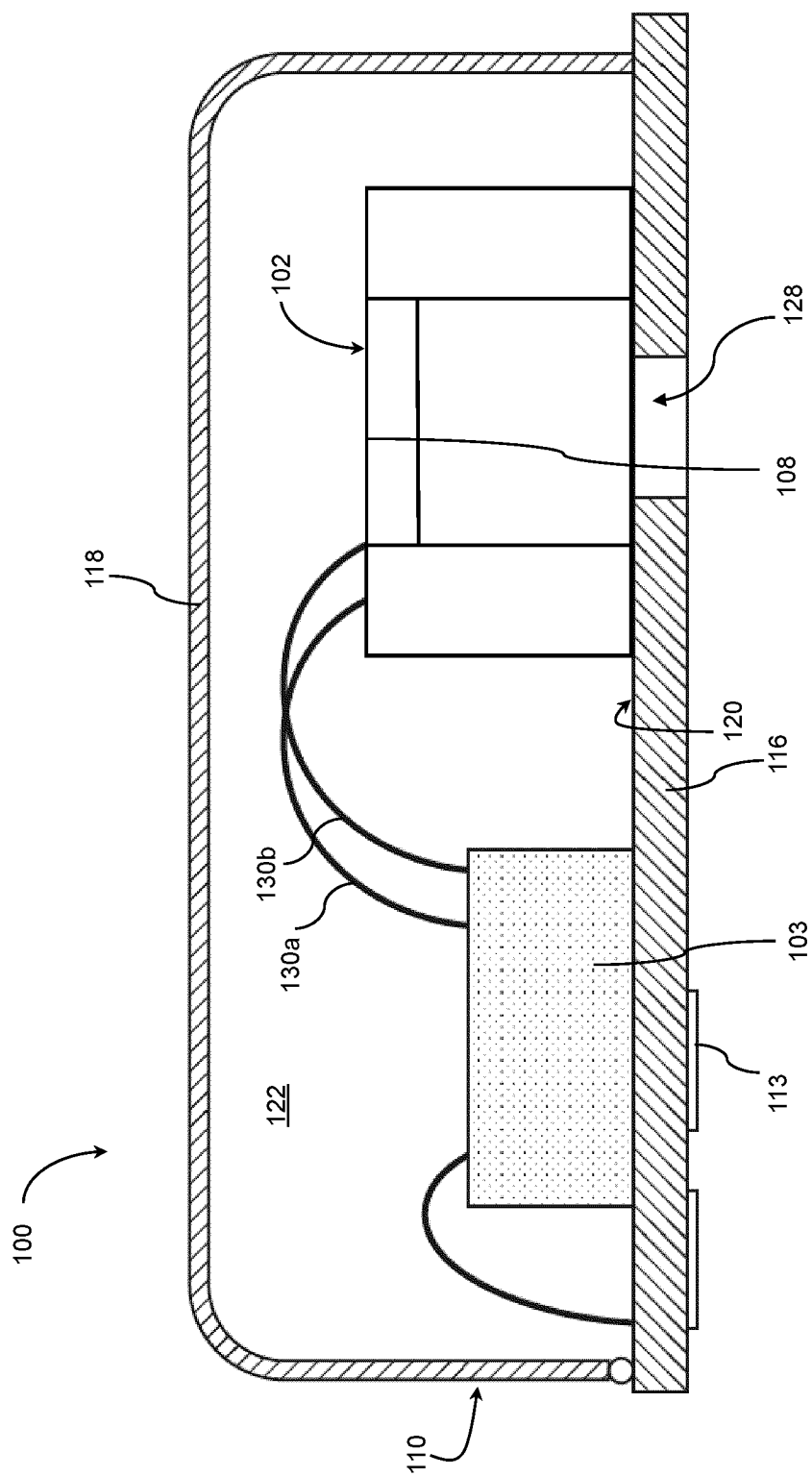
FIG. 1 is a cross-sectional view of a sensor assembly.

The sensor assembly generally comprises a transducer and an electrical circuit disposed in a housing configured to interface with a host device. FIG. 1 is a cross-sectional view of a sensor assembly 100 comprising a transducer 102 coupled to an electrical circuit 103 disposed within a housing 110. The housing includes a substrate 116 and a cover 118 fastened to an upper surface 120 of the substrate. The housing also includes an electrical interface with contacts (e.g., supply, ground, data, clock, select, etc.) configured to interface with a host device. In FIG. 1, the host-interface is a surface-mount interface 113 located on an outer surface of the substrate 116 and is suitable for reflow soldering processes. In other embodiments, the host-interface can have some other form factor, like through-hole pins, or be located on some other part of the housing.

In some sensor assemblies like microphone assemblies the housing includes an aperture (also called a "port" herein) connecting an interior of the housing to the external environment. In FIG. 1, the housing port 128 is located on the substrate 116 in alignment with the transducer 102. In other sensor assemblies, the port can be on some other part of the housing, like the cover or sidewall. A port is not require in some other sensor assemblies, like acoustic vibration sensors and accelerometers, among others. Transducer sensitivity drift can be caused by variations in environmental conditions like humidity that propagate through the port and by other variations like temperature in the absence of a port.

In one embodiment, the sensor assembly is a microphone and the transducer is configured to detect atmospheric acoustic signals and generate an electrical signal representative of the signals detected. In other embodiments, the transducer and electrical circuit are configured to detect and generate electrical signals representative of acoustic vibrations, pressure, acceleration, humidity and temperature among other conditions. The transducer may be a capacitive, piezoelectric, optical or other transduction device implemented as a microelectromechanical systems (MEMS) device or as some other known or future device.

Figure 2:
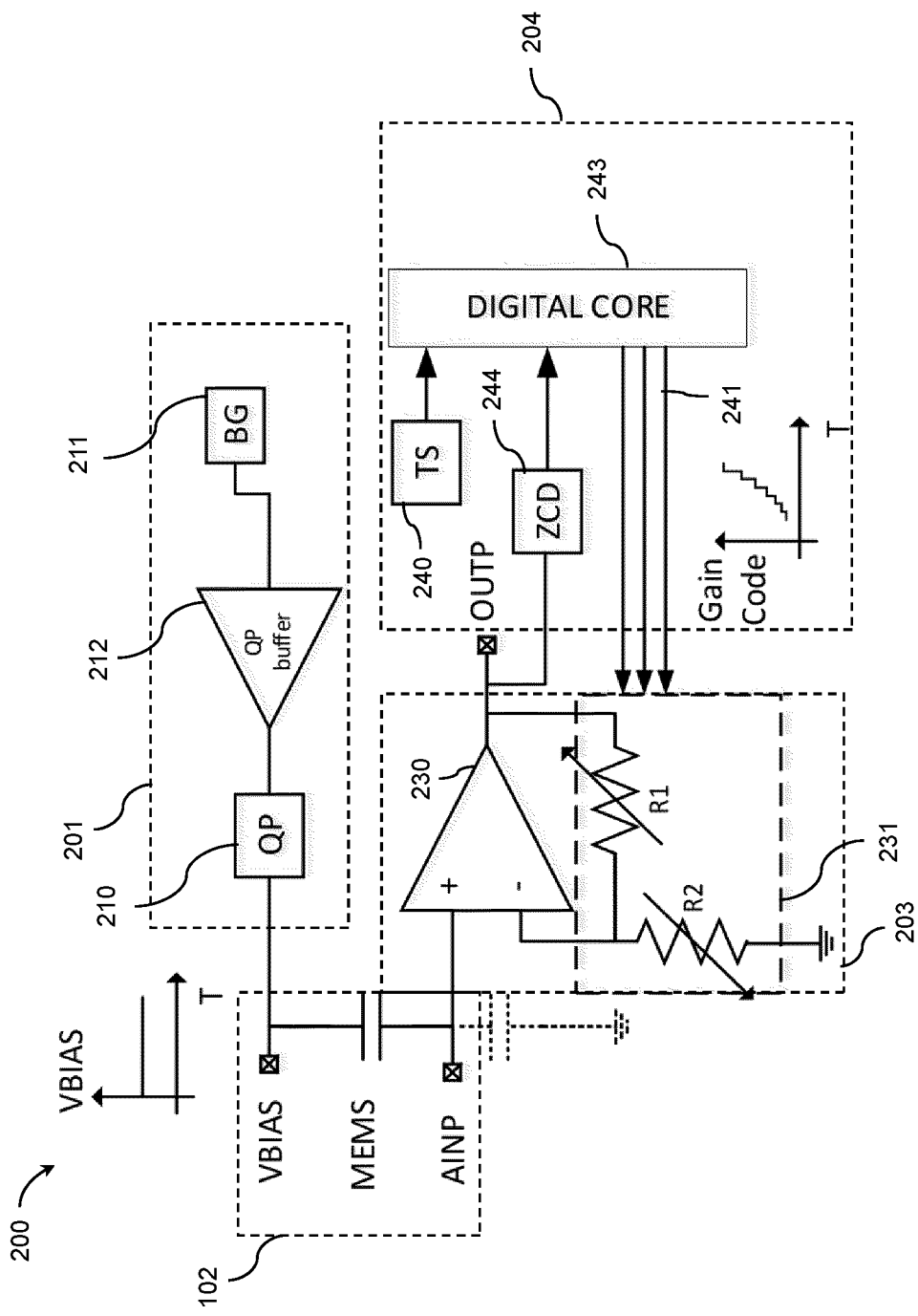
FIG. 2 is a schematic block diagram of a sensor assembly.
Figure 3:
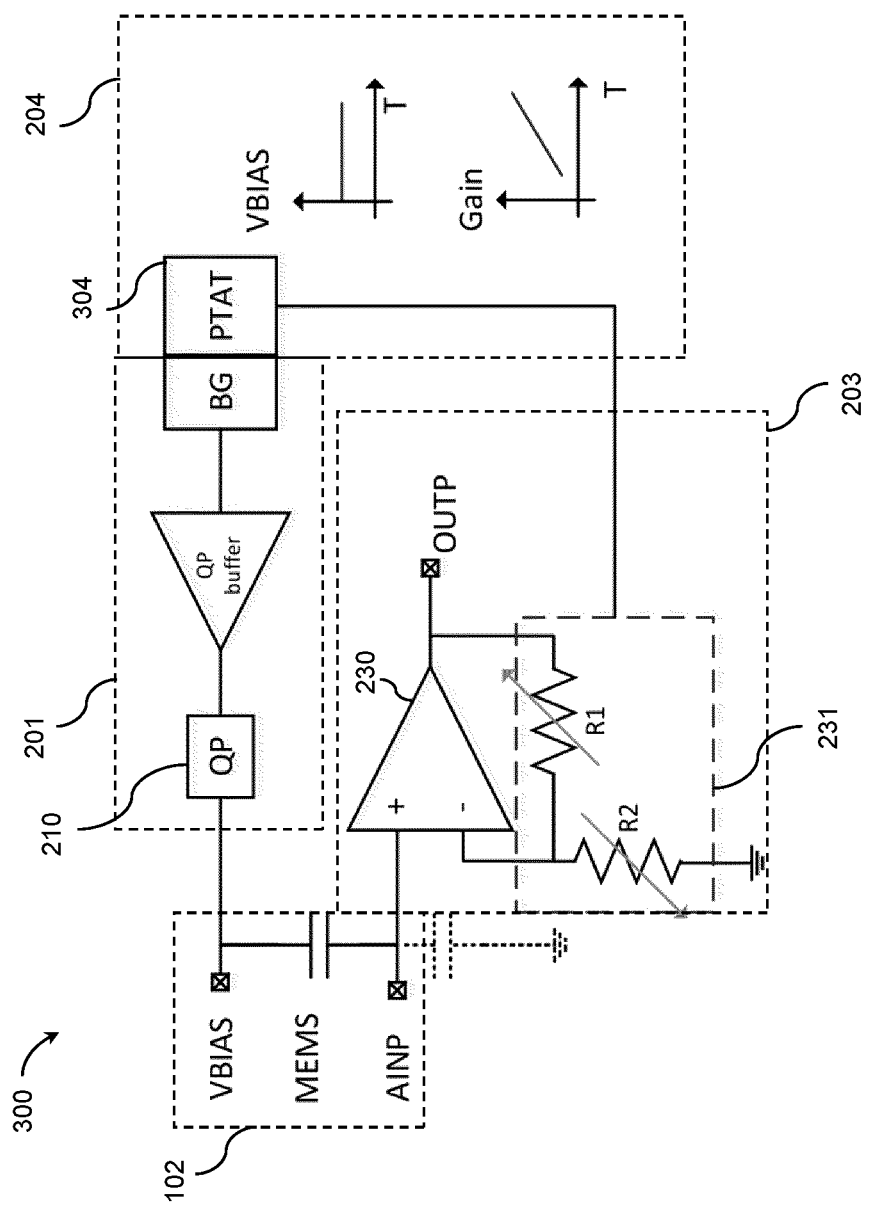
FIG. 3 is a schematic block diagram of an alternative sensor assembly.
Figure 4:
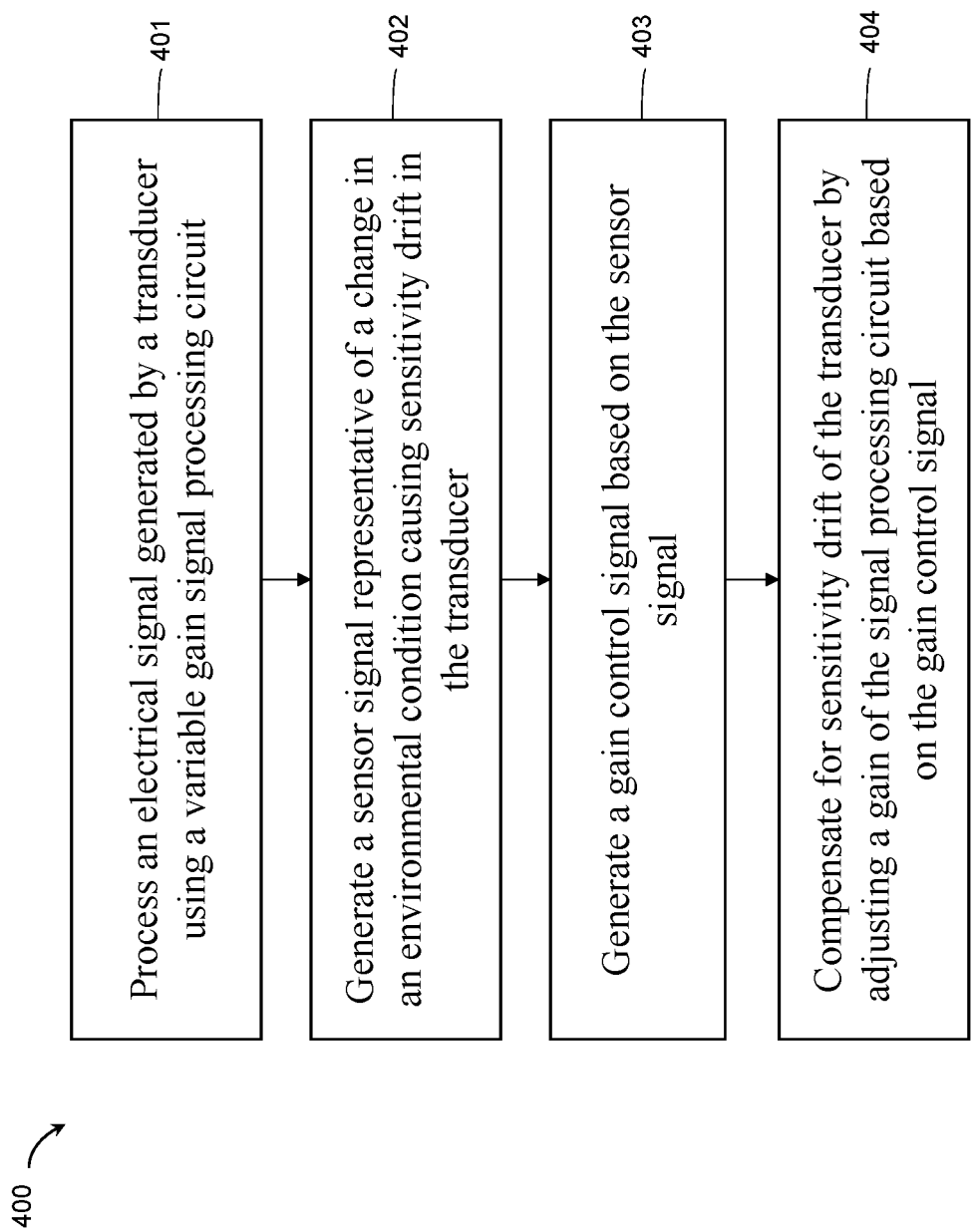
FIG. 4 depicts a flow diagram of a method operating a sensor assembly.

The electrical circuit generally comprises a processing circuit configured to process the electrical signal produced by the transducer and to provide the processed output signal at the host interface of the sensor assembly. In FIG. 1, the electrical circuit 103 is coupled to the transducer 102 via leads 130a and 130b and to contacts on the host interface 113 for this purpose. The processing circuit includes a variable gain circuit coupled to the transducer. The variable gain circuit can be an amplifier or a buffer-amplifier, or some other variable gain circuit. In FIGS. 2-3, a transducer 102 is coupled to a variable gain circuit 203 comprising a closed-loop amplifier 230 having a gain adjustment circuit 231. The gain adjustment circuit is configured as an adjustable voltage divider including R1 and R2, but other embodiments can include other circuit elements, like capacitors, in lieu of or in combination with resistors. Other variable gain circuits can be used in other implementations. In the sensor assembly operational process of FIG. 4, at block 401, a variable gain signal processing circuit processes the electrical signal generated by the transducer before the processed signal is output at the host interface of the sensor assembly.

The processing circuit can optionally include other circuit elements like a filter and an analog-to-digital converter (ADC) among others, depending on the sensor type, required output signal format, etc. The electrical circuit may be implemented as one or more integrated circuits (ICs). Such ICs can include, for example, an application specific integrated circuit (ASIC) with analog and/or digital circuits, a digital signal processor (DSP), among other ICs, alone or in combination.

According to one aspect of the disclosure, the sensor assembly comprises a gain control circuit comprising an environmental sensor configured to generate an environmental sensor signal based on a detected change in an environmental condition affecting sensitivity drift in the transducer. The environmental sensor is located in proximity to the transducer and the gain control circuit can be calibrated to provide an appropriate gain control signal based on the environmental sensor signal. In the sensor assembly operational process of FIG. 4, at block 402, the environmental sensor generates a sensor signal representative of a change in an environmental condition causing sensitivity drift in the transducer. At block 403, the gain control circuit generates a gain control signal based on the environmental sensor signal.

The variable gain circuit is coupled to the gain control circuit and configured to adjust gain applied to the electrical signal received from the transducer based on the gain control signal, wherein the gain adjustment compensates for sensitivity drift of the transducer caused by change in the environmental condition sensed by the environmental sensor. In the sensor assembly operational process of FIG. 4, at block 404, the gain control circuit compensates for sensitivity drift of the transducer by adjusting the gain of the signal processing circuit based on the gain control signal. The gain control circuit including the environmental sensor can be integrated, along with the signal processing circuit, as part of an integrated circuit (IC) of the sensor assembly.

In one implementation, the gain control circuit is implemented as a digital circuit that generates a digital signal used to control gain applied to the electrical signal generated by the transducer. In FIG. 2, the gain control circuit 204 comprises an environmental sensor 240 coupled to a digital logic circuit 243. The digital logic circuit is configured to determine a gain value based on the environmental sensor signal, wherein the gain control signal is based on the gain value. The logic circuit can obtain the gain value by reference to a look-up table (LUT) that relates environmental sensor signal values to corresponding gain values. The LUT data can be stored in a one-time programmable (OTP) memory during manufacture of the sensor assembly. Alternatively, the logic circuit can be implemented as a digital processor that obtains the gain value by executing an algorithm that determines the gain value based on a function of the environmental sensor signal. FIG. 2 shows the digital logic circuit 243 having an output coupled to the gain adjustment circuit 231 of the variable gain circuit 203, wherein the gain adjustment circuit adjusts the gain based on the output from the digital logic circuit. The environmental sensor 240 can be part of the integrated circuit including the signal processing and digital logic circuits. Alternatively, the environmental sensor can be physically separated from the gain control circuit and instead be integrated with the transducer or be located on or embedded in the substrate.

In some digital implementations, the digital logic circuit is configured to adjust gain of the signal processing circuit in steps sufficiently small to prevent artifacts in the output signal of the signal processing circuit. For example, a gain step of not more than 0.1 decibels (dB) every 10 milliseconds (ms) can substantially reduce acoustic artifacts in a microphone assembly. Other gain step limitations may be suitable for other sensor assemblies depending on type, use case and performance specifications, among other considerations.

In other digital implementations, the digital logic circuit comprises a zero-crossing detector (ZCD) coupled to the signal processing circuit, wherein the digital logic circuit is configured to adjust gain applied to the electrical signal generated by the transducer based on occurrence of a zero-crossing event of the signal processing circuit. In FIG. 2, a ZCD is coupled to the output of the variable gain circuit 203 and the digital logic circuit adjusts the gain when a zero-crossing occurs at the output of the variable gain device 230. The ZCD can be used alone or in combination with gain step limitations to further reduce artifacts in the processed signal.

In another implementation, the gain control circuit is implemented as an analog circuit that generates a variable analog signal used to control gain applied to the electrical signal generated by the transducer. In FIG. 3, the gain control circuit 204 comprises an environmental sensor 304 having an output coupled to the adjustable gain circuit 231 of the variable gain device. The environmental sensor is configured to detect, and generate a variable reference signal, based on variation in the environmental condition. In one implementation, the environmental sensor produces a variable reference signal (e.g., a variable voltage or current) having a positive or negative slope. Thus the variable analog reference signal can be used to adjust the gain of the variable gain circuit. One such environmental sensor suitable for detecting temperature variations is a proportional to absolute temperature (PTAT) device, wherein the gain applied to the electrical signal changes in proportion to changes in temperature. More generally, the environmental sensor can comprise any sensor that generates a variable output signal representative of variations in the environmental condition affecting the sensitivity of the transducer.

In some implementations, the sensor assembly comprises a capacitive transducer, for example, a MEMS device, and the electrical circuit comprises a bias circuit coupled to the transducer and configured to apply a bias voltage VBIAS to the capacitive transducer. In FIGS. 2 and 3, the electrical circuit includes a bias circuit 201 comprising a charge pump 210 having a reference input provided by a band gap reference 211 via a buffer 212, wherein the output of the charge pump is based on the reference signal applied to the buffer. Other transducers, for example, piezoelectric devices, do not require a bias voltage and thus some sensor assemblies do not include a bias circuit.

In some implementations, the sensor assembly is a microphone or acoustic vibration sensor assembly comprising a digital or analog gain control circuit that compensates for transducer sensitivity drift caused by variations in environmental temperature, as described herein.

In microphones and some other sensor assemblies, the input impedance of the processing circuit is selected to produce a desired electronic low frequency roll off (LFRO) based on the impedance of the transducer. For example a transducer with a capacitance on the order of 1 pF coupled to a variable gain low noise amplifier having an input resistance on the order of 1 gigaohm (Gohm) would produce an LFRO of about 1.6 Hz. Other LFRO frequencies can be selected by appropriate selection of the transducer capacitance and input resistance of the processing circuit. These selected capacitance and resistance values and corresponding LFRO are merely examples and are not intended to limit the scope of the disclosure. In microphones for example the LFRO may be lower than 1.6 Hz and as high as 100 Hz or more, depending on noise conditions.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described but by the appended claims and their equivalents.

What is claimed is:

1. A sensor assembly comprising:
a housing having an external-device interface;
a transducer disposed in the housing and configured to generate an electrical signal;
a gain control circuit comprising an environmental sensor configured to generate an environmental sensor signal based on a change in an environmental condition, the environmental condition affecting drift in sensitivity of the transducer; and
an integrated circuit disposed in the housing and electrically coupled to contacts of the external-device interface, the integrated circuit comprising:
a signal processing circuit coupled to the transducer and to the gain control circuit, the signal processing circuit configured to generate an output signal based on the electrical signal and to adjust a gain of the signal processing circuit based on the environmental sensor signal;
wherein the gain adjustment compensates for the drift in sensitivity of the transducer caused by the change in the environmental condition.

2. The sensor assembly of claim 1, the gain control circuit configured to generate a gain control signal based on the environmental sensor signal, wherein gain adjustment of the signal processing circuit is based on the gain control signal.

3. The sensor assembly of claim 2, the gain control circuit including a digital logic circuit coupled to the environmental sensor and configured to determine a gain value based on the environmental sensor signal, wherein the gain control signal is based on the gain value.

4. The sensor assembly of claim 3 is a microphone assembly, wherein the gain control circuit is configured to adjust gain of the signal processing circuit in steps sufficiently small to prevent acoustic artifacts in the output signal of the signal processing circuit.

5. The sensor assembly of claim 4 further comprising a zero-crossing detector coupled to the signal processing circuit, wherein the digital logic circuit is configured to adjust gain of the signal processing circuit based on occurrence of a zero-crossing event of the signal processing circuit.

6. The sensor assembly of claim 3, the signal processing circuit is a closed-loop amplifier having an adjustable voltage divider, wherein the gain control circuit controls gain of the signal processing circuit by adjusting the voltage divider.

7. The sensor assembly of claim 6 is microphone assembly and the environmental sensor is a temperature sensor integrated with the integrated circuit.

8. The sensor assembly of claim 2 is a microphone assembly comprising a transducer bias circuit coupled to the transducer, wherein the transducer is a capacitive microelectromechanical systems (MEMS) transducer having a capacitance on the order of 1 pF, and the signal processing circuit has an input resistance on the order of 1 Gohm.

9. An integrated circuit for interfacing with a transducer of a sensor assembly, the integrated circuit comprising:
a signal processing circuit connectable to the transducer and configured to generate an output signal based on an electrical signal received from the transducer when the integrated circuit is interfaced with the transducer;
a gain control circuit configured to adjust gain of the signal processing circuit based on an environmental sensor signal representative of change in an environmental condition that affects drift in sensitivity of the transducer,
wherein the gain adjustment compensates for drift in sensitivity of the transducer caused by the change in the environmental condition.

10. The integrated circuit of claim 9 further comprising an environmental sensor configured to generate the environmental sensor signal, the gain control circuit coupled to the environmental sensor and configured to generate a gain control signal based on the environmental sensor signal, wherein gain adjustment of the signal processing circuit is based on the gain control signal.

11. The integrated circuit of claim 10, wherein the environmental sensor is a pressure sensor, a temperature sensor, or a humidity sensor.

12. The integrated circuit of claim 9, the gain control circuit including a digital logic circuit coupled to the environmental sensor and configured to determine a gain value based on the environmental sensor signal, wherein the gain control signal is based on the gain value.

13. The integrated circuit of claim 12, wherein the gain control circuit is configured to adjust gain of the signal processing circuit in steps sufficiently small to prevent artifacts in the output signal of the signal processing circuit.

14. The integrated circuit of claim 12 further comprising a zero-crossing detector coupled to the signal processing circuit, wherein the digital logic circuit is configured to adjust gain of the signal processing circuit based on occurrence of a zero-crossing event of the signal processing circuit.

15. The integrated circuit of claim 12, wherein the signal processing circuit is a closed-loop amplifier having an adjustable voltage divider.

16. The integrated circuit of claim 10, further comprising a transducer bias circuit configured to generate a bias voltage signal for a capacitive transducer when the integrated circuit is interfaced with the capacitive transducer.

17. The integrated circuit of claim 16 in combination with a capacitive microelectromechanical systems (MEMS) transducer.

18. A method of compensating for sensitivity drift of a transducer in a sensor assembly, the method comprising:
processing an electrical signal generated by the transducer using a signal processing circuit of an integrated circuit;
generating an environmental sensor signal representative of a change in an environmental condition causing sensitivity drift in the transducer;
generating a gain control signal based on the environmental sensor signal using the signal processing circuit of the integrated circuit; and
compensating for sensitivity drift of the transducer caused by the change in the environmental condition by adjusting gain of the signal processing circuit based on the gain control signal using the signal processing circuit of the integrated circuit.

19. The method of claim 18, further comprising adjusting gain of the signal processing circuit based on occurrence of a zero-crossing event of the signal processing circuit.

20. The method of claim 19, further comprising adjusting gain of the signal processing circuit in steps sufficiently small to prevent artifacts in the processed electrical signal.

* * * * *